United States Patent
Werthessen

(10) Patent No.: US 10,154,184 B2
(45) Date of Patent: Dec. 11, 2018

(54) CAMERA MODULE AND METHOD FOR THE PRODUCTION THEREOF

(71) Applicant: Conti Temic microelectronic GmbH, Nürnberg (DE)

(72) Inventor: Boris Werthessen, Weißensberg (DE)

(73) Assignee: Conti Temic microelectronic GmbH, Nürnberg (DE)

( * ) Notice: Subject to any disclaimer, the term of this patent is extended or adjusted under 35 U.S.C. 154(b) by 0 days.

(21) Appl. No.: 15/548,144

(22) PCT Filed: Jan. 27, 2016

(86) PCT No.: PCT/DE2016/200047
§ 371 (c)(1),
(2) Date: Aug. 2, 2017

(87) PCT Pub. No.: WO2016/124184
PCT Pub. Date: Aug. 11, 2016

(65) Prior Publication Data
US 2018/0020140 A1    Jan. 18, 2018

(30) Foreign Application Priority Data

Feb. 5, 2015 (DE) ........................ 10 2015 201 998

(51) Int. Cl.
*H04N 5/225* (2006.01)
*G03B 17/12* (2006.01)
(Continued)

(52) U.S. Cl.
CPC ............. *H04N 5/2257* (2013.01); *G02B 7/02* (2013.01); *G02B 7/023* (2013.01); *G02B 7/025* (2013.01);
(Continued)

(58) Field of Classification Search
CPC .. H04N 5/2257; H04N 5/2254; H04N 5/2253; G02B 7/02; H01L 27/14627; H01L 27/14618; H01L 27/14685
See application file for complete search history.

(56) References Cited

U.S. PATENT DOCUMENTS 5,559,556 A * 9/1996 Kagebeck .............. H04N 1/028
348/335
5,783,815 A    7/1998 Ikeda
(Continued)

FOREIGN PATENT DOCUMENTS

DE          10344767 A1    5/2005
DE      102012206831 A1    10/2013
(Continued)

OTHER PUBLICATIONS

Wikipedia.de: "Steckplatine," Jan. 4, 2015, XP002756199, Retrieved from the Internet: URL:https://de.wikipedia.org/w/index.php?title=Steckplatine&oldid=137400902 [retrieved on Apr. 7, 2016], 2 pages.
(Continued)

*Primary Examiner* — Timothy J Henn
(74) *Attorney, Agent, or Firm* — RatnerPrestia

(57) ABSTRACT

A camera module includes a circuit carrier, an image sensor chip arranged on the circuit carrier and an optics module with an optics housing accommodating a lens. Provision is made for the optics housing to be embodied with at least three press-fit pins, the optics housing to be connected to the circuit carrier by way of the three press-fit pins with a predetermined distance from the circuit carrier, wherein the circuit carrier is embodied with at least three press-fit holes for establishing a press-fit connection by the press-fit pins. Furthermore, the invention relates to a method for producing the camera module.

13 Claims, 3 Drawing Sheets

(51) Int. Cl.
*G03B 43/00* (2006.01)
*H01L 27/146* (2006.01)
*G02B 7/02* (2006.01)
*H04M 1/02* (2006.01)

(52) U.S. Cl.
CPC .............. *G03B 17/12* (2013.01); *G03B 43/00* (2013.01); *H01L 27/14618* (2013.01); *H01L 27/14627* (2013.01); *H01L 27/14685* (2013.01); *H04N 5/2253* (2013.01); *H04N 5/2254* (2013.01); *H04M 1/0264* (2013.01)

(56) References Cited

U.S. PATENT DOCUMENTS

| | | | |
|---|---|---|---|
| 7,227,577 B2 | 6/2007 | Tanida et al. | |
| 7,670,064 B2 | 3/2010 | Frenzel | |
| 8,553,131 B2 * | 10/2013 | Tseng | G02B 27/62 348/335 |
| 9,485,400 B2 | 11/2016 | Muller et al. | |
| 2003/0112364 A1 | 6/2003 | Tanida et al. | |
| 2005/0007484 A1 * | 1/2005 | Tan | H04N 5/2253 348/340 |
| 2005/0041098 A1 * | 2/2005 | Tan | H04N 5/2253 348/95 |
| 2005/0052568 A1 * | 3/2005 | Tan | H01L 27/14618 348/374 |
| 2010/0182497 A1 * | 7/2010 | Tsai | H04N 5/2251 348/374 |
| 2010/0247086 A1 * | 9/2010 | Tallaron | G02B 3/14 396/133 |
| 2010/0278524 A1 * | 11/2010 | Woo | G03B 17/00 396/529 |
| 2011/0019062 A1 * | 1/2011 | Honda | H01L 27/14618 348/335 |
| 2011/0134303 A1 * | 6/2011 | Jung | H01L 27/14618 348/340 |
| 2012/0044591 A1 * | 2/2012 | Lee | G02B 13/0085 359/819 |
| 2014/0036146 A1 * | 2/2014 | Choi | H04N 5/2254 348/374 |
| 2015/0130941 A1 | 5/2015 | Bauer et al. | |
| 2015/0138436 A1 * | 5/2015 | Wong | H04N 5/2257 348/374 |
| 2017/0163855 A1 * | 6/2017 | Molin | H04N 5/2254 |

FOREIGN PATENT DOCUMENTS

| | | |
|---|---|---|
| DE | 102013102819 A1 | 9/2014 |
| EP | 0585186 B1 | 3/1994 |
| JP | 2000069336 A | 3/2000 |
| JP | 2004146946 A | 5/2004 |
| WO | 2013160107 A2 | 10/2013 |

OTHER PUBLICATIONS

Wikipedia.de: "Leiterplatte/Prototypen," Jan. 3, 2015, XP002756200, Retrieved from the Internet: URL:https://de.wikipedia.org/w/index.php?title=Leiterplatte&oldid=137362650#Prototypen [retrieved on Apr. 7, 2016] Abschnitt "Prototypen", 15 pages.
German Search Report for German Application No. 10 2015 201 998.5, dated Oct. 29, 2015, including partial English translation, 8 pages.
International Search Report and Written Opinion for International Application No. PCT/DE2016/200047, dated Apr. 22, 2016, 10 pages.
Wikipedia.de: "Steckplatine," Jan. 4, 2015, XP002756199, Retrieved from the Internet: URL:https://de.wikipedia.org/w/index.php?title=Steckplatine&oldid=137400902 [retrieved on Apr. 7, 2016] 3 pages.
Wikipedia.de: "Leiterplatte/Prototypen," Jan. 3, 2015, XP002756200, Retrieved from the Internet: URL:https://de.wikipedia.org/w/index.php?title=Leiterplatte&oldid=137362650#Prototypen [retrieved on Apr. 7, 2016] Abschnitt "Prototypen" 10 pages.
International Preliminary Report on Patentability and Written Opinion for International Application No. PCT/DE2016/200047, dated Aug. 8, 2017, 8 pages.

* cited by examiner

CAMERA MODULE AND METHOD FOR THE PRODUCTION THEREOF

CROSS REFERENCE TO RELATED APPLICATIONS

This application is the U.S. National Phase Application of PCT International Application PCT/DE2016/200047, filed Jan. 27, 2016, which claims priority to German Patent Application No. 10 2015 201 998.5, filed Feb. 5, 2015, the contents of such applications being incorporated by reference herein.

FIELD OF THE INVENTION

The invention relates to a camera module comprising a circuit carrier having an image sensor chip and an optics module. Furthermore, the invention relates to a method for producing such a camera module.

BACKGROUND OF THE INVENTION

Such camera modules are used in vehicles to record the vehicle surroundings, in order to be able to use the image data for a variety of functions such as e.g. for lane detection, traffic sign recognition, high-beam assistance, collision warning, pedestrian detection, etc., wherein interventions in the vehicle control systems, e.g. brake or engine control systems, also take place on the basis of the evaluated image data. The quality of the same in terms of focusing and tilting is crucial for the use of such camera modules as a fixed-focus camera system in driver assistance systems.

These camera modules generally have a construction made up of a printed circuit board which serves as a support plate and which is equipped with an image sensor, and an optics module fixed thereon with an optics housing accommodating a lens.

In order to focus the optics module a fixture is required which makes it possible to adjust the distance between the lens of the optics module and the image sensor. In the simplest case, this is effected via a screw thread. The disadvantage of this is that adjustment is therefore only possible along an axis and, as a result, tilting and decentering of the lens with respect to the image sensor are not feasible and, as a consequence, not all image regions are in focus.

In order to be able to adjust multiple axes, an adhesive connection is frequently selected and the optics are, in the process, simultaneously aligned in multiple axes to the image sensor. However, the disadvantage of using adhesive beads is that the adhesive expands or contracts during the curing and drying of the adhesive and in the event of a temperature change and over its lifetime, resulting in a change in position of the lens relative to the image sensor, which leads to a blurry picture. In addition, the long drying times in the curing oven of approx. 30 to 60 minutes are also disadvantageous.

A generic camera module is known from DE 103 44 67 A1, which is incorporated by reference, which can be mounted without complex adjusting and focusing. This camera module comprises a circuit carrier, a housed image sensor arranged on the circuit carrier and an optics module comprising optics and an optics housing. A support is designed as a ring collar on the housing of the image sensor, on which support the optics module can support itself. It can be considered a disadvantage of this camera module that an image sensor with a specially embodied housing is required.

SUMMARY OF THE INVENTION

Starting from this prior art, an aspect of the invention is a camera module of the aforementioned type, which has a structurally simple design without the aforementioned disadvantages and which nevertheless allows a high adjustment precision. Furthermore, an aspect of the invention is a method for producing such a camera module according to the invention, in particular assembly and connection technology for the camera module.

Such a camera module comprising
a circuit carrier,
an image sensor chip arranged on the circuit carrier, and
an optics module with an optics housing accommodating a lens, is characterized according to the invention in that
the optics housing is embodied with at least three press-fit pins, and
the optics housing is connected to the circuit carrier by way of the at least three press-fit pins with a predetermined distance from the circuit carrier.

In this camera module according to an aspect of the invention, the press-fit pins serve as a mechanical connection means for mounting the optics module on the circuit carrier. The press-fit pins are designed in terms of their rigidity such that the stability thereof is not affected by a mechanical shock, by the self-weight of the optics module or by other influences. The relative position of the optics module to the circuit carrier remains stable. In particular, the optics module can be simply adjusted perpendicularly to the circuit carrier, since the press-fit pins can be displaced in their insertion direction. A tilting of the optics module with respect to the image sensor can also be compensated for by different press-fit depths of the pressed-in press-fit pins.

According to an advantageous embodiment of the invention, the at least three press-fit pins are embodied flexibly in such a manner that the optics housing is adjusted to the image sensor chip by utilizing the flexibility of the press-fit pins as a result of a relative change in position produced by means of an adjusting machine with respect to the circuit carrier.

The realization that the press-fit pins of the press-fit connection of the optics housing to the circuit carrier, which is preferably embodied as a printed circuit board, have a low flexibility is exploited, following the production of the press-fit connection, to carry out an adjustment of the optics module with respect to the image sensor chip by means of the press-fit pins. The press-fit pins have a stiffness, meaning they have no flexibility due to mechanical shock or self-weight or other influences, but they can be bent by an adjusting machine in order to adjust the optics module with respect to the image sensor chip.

By utilizing the low flexibility of the press-fit pins of the press-fit connection, a high adjustment precision of up to +/−1 μm is achieved simply, without an increased tolerance requirement having to be set for the other components of the camera module according to the invention. The increased adjustment precision makes it possible to reduce the pixel size of the image sensor chip and therefore increase the resolution thereof, without the need for superior optics for the lens.

According to an advantageous further development of the invention, in order to create multiple press-fit connections which differ in the relative position of the optics housing to the circuit carrier, the circuit carrier is embodied with a regular pattern of press-fit holes, with which the optics housing is adjusted relative to the circuit carrier in a plane parallel to the circuit carrier through a selection of the at least three press-fit holes. This makes it possible by means of a suitable selection of the at three press-fit holes to first make a preliminary adjustment in a x-y plane parallel to the circuit carrier, in order to subsequently make a final adjustment by means of an adjusting machine, utilizing the flexibility of the press-fit pins. It is also possible to make a final adjustment by making an appropriate selection of the press-fit holes depending on the design and accuracy requirements, without the need for a subsequent adjustment by way of the flexibility of the press-fit pins.

The press-fit holes can be arranged in rows and columns with equal distances on the circuit carrier in order to establish a regular pattern. Other patterns such as, for example, multiple rings offset from each other can also be used.

Another advantageous embodiment of the invention makes provision for the adjusted or preliminary adjusted optics housing to be connected to the circuit carrier by means of an adhesive connection bridging the distance thereof from the circuit carrier. On the one hand, this seals the gap between the optics housing and the circuit carrier and, on the other hand, this improves the press-fit connection of the optics housing to the circuit carrier.

Furthermore, a further development of the invention makes provision for the projecting press-fit pins on the side of the circuit carrier facing away from the optics module to be embodied with an accumulation of soldering material lying in contact with the circuit carrier. The press-fit connection is additionally stabilized with such an additional soldering, for example by wave soldering.

Finally, according to a last embodiment of the invention, the press-fit pins are embodied in order to electrically contact the optics module with the circuit carrier. The press-fit pins therefore not only serve as a mechanical connection means between the optics module and the circuit carrier, but also to contact electrical or electronic components of the optics module. An autofocus, electrical heating for the lenses of the lens, polarizers or active electro-optical filters can therefore be realized, for example, as an electrical function.

This method for producing a camera module is distinguished by at least the following method steps:
  providing a circuit carrier, on which an image sensor chip is arranged,
  providing an optics module with an optics housing accommodating a lens,
  embodying the optics housing with at least three flexible press-fit pins, and
  connecting the optics housing to the circuit carrier by way of the three flexible press-fit pins with a predetermined distance from the circuit carrier, wherein the circuit carrier is embodied with at least three press-fit holes for establishing a press-fit connection by means of the press-fit pins.

According to an advantageous embodiment of the invention, the at least three press-fit pins are embodied flexibly in such a manner that the optics housing is adjusted to the image sensor chip by means of an adjusting machine by utilizing the flexibility of the press-fit pins as a result of a relative change in position with respect to the circuit carrier.

The realization that the press-fit pins of the press-fit connection have a low flexibility is used, following the production of the press-fit connection between the optics module and the circuit carrier, to modify or displace the position of the optics module in order to adjust it to the image sensor chip by bending the press-fit pins. To this end, an excessive bending of the press-fit pins may also be necessary to compensate for a possible rebound of the press-fit pins.

According to a particularly preferred embodiment of the invention, in order to create multiple press-fit connections which differ in the relative position of the optics housing to the circuit carrier, the circuit carrier is embodied with a regular pattern of press-fit holes, with which the optics housing is finally or preliminarily adjusted relative to the circuit carrier in a plane parallel to the circuit carrier through a selection of the at least three press-fit holes. In the case of a preliminary adjustment, the final adjustment of the optics module is subsequently made by means of an adjusting machine, utilizing the flexibility of the press-fit pins.

Furthermore, according to another embodiment of the invention, the adjusted optics housing is connected to the circuit carrier by means of an adhesive connection bridging the distance thereof from the circuit carrier. On the one hand, this seals the gap between the optics housing and the circuit carrier and, on the other hand, this improves the press-fit connection of the optics housing to the circuit carrier.

According to a last advantageous embodiment of the invention, the projecting press-fit pins on the side of the circuit carrier facing away from the optics module are embodied with an accumulation of soldering material lying in contact with the circuit carrier. The press-fit connection is additionally stabilized with such additional soldering, e.g. by wave soldering.

BRIEF DESCRIPTION OF THE DRAWINGS

The invention will be explained in further detail below, with reference to the attached figures, wherein.

DETAILED DESCRIPTION OF THE PREFERRED EMBODIMENTS

Figure 1:
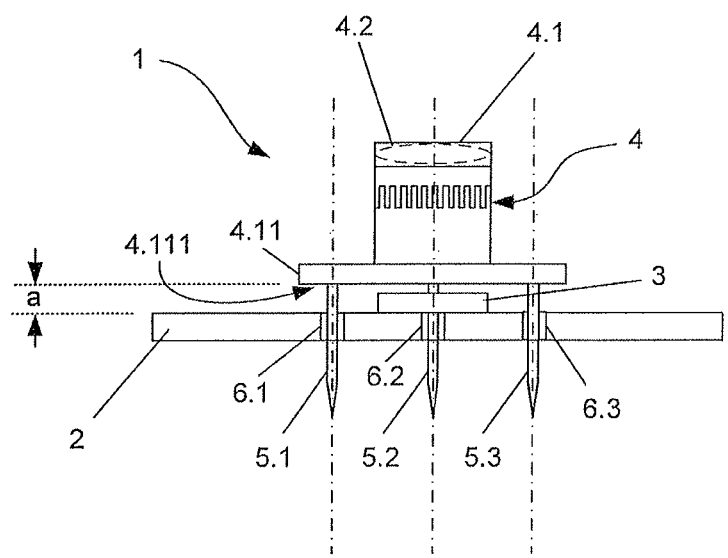
FIG. 1 shows a sectional view of a camera module according to an aspect of the invention, in which the optics module is connected to a circuit carrier by way of a press-fit connection.

The production of a camera module 1 according to an aspect of the invention will be explained below with reference to FIGS. 1 to 5. Such a camera module 1 comprises, as components, a circuit carrier 2 which is designed as a rigid printed circuit board, on which circuit carrier an image sensor chip 3 is arranged and an optic module 4 having a lens 4.2 arranged in an optics housing 4.1. This optics module 4 is mechanically connected to the circuit carrier 2 by way of a press-fit connection in such a manner that the electromagnetic radiation falling into the lens of the optics module 4 is guided onto the image sensor chip 3. To this end, a corresponding adjustment operation is carried out, which is explained below.

Press-fit technology as a solder-free connection technology for electrically contacting electrical or electronic components on printed circuit boards is known to the person skilled in the art. In order to produce such a press-fit connection, a press-fit pin is pressed into a through-connected hole (called a press-fit hole) of a printed circuit board, so that a contact is made with the printed circuit board copper of the press-fit hole across a press-fit zone of the press-fit pin.

The press-fit connection of the optics module 4 to the circuit carrier 2 is effected according to FIGS. 1 to 5 by way of three press-fit pins 5.1, 5.2 and 5.3, which are guided out of a plate-shaped section 4.11 of the optics housing 4.1 perpendicularly to the surface and therefore arranged parallel to one another. The press-fit pins 5.1, 5.2 and 5.3 are molded in at the same time as the optics housing 4.1 is produced.

At least three press-fit pins 5.1, 5.2 and 5.3 are required to adjust the optics module 4 with respect to the image sensor chip 3, which press-fit pins are arranged on the bottom 4.111 of the plate-shaped section 4.11 in an equilateral triangle. The associated press-fit holes 6.1, 6.2 and 6.3 are also arranged on the circuit carrier 2 in corresponding geometry The optics module 4 can of course also be designed with a larger number of press-fit pins, so that the number of press-fit holes on the circuit carrier 2 is also increased accordingly.

The press-fit pins 5.1, 5.2 and 5.3 have a length which projects beyond the bottom 4.111 so that when the press-fit pins 5.1, 5.2 and 5.3 are pressed into the press-fit holes 6.1, 6.2 and 6.3, the optics module 4 is located at a predetermined distance a from the circuit carrier 2, wherein this distance a relates to the distance between the bottom 4.111 and the surface of the circuit carrier 2 facing the optics module 4. To ensure that the optics module 4 of this position which is at a distance from the circuit carrier 2 has sufficient stability with respect to the circuit carrier 2, the press-fit pins 5.1, 5.2 and 5.3 which are located in the area of the press-fit holes 6.1, 6 2 and 6.3 are embodied with a press-fit zone. On the basis of the observed distance a, a bending zone which in each case bridges the distance a between the optics module 4 and the circuit carrier 2 is located at the press-fit pins 5.1, 5.2 and 5.3. Since the press-fit pins 5.1, 5.2 and 5.3 are slightly flexible, the flexibility of these press-fit pins 5.1, 5.2 and 5.3 is used, following the production of the press-fit connection, to make an adjustment of the optics module 4 with respect to the image sensor chip 3 by way of the press-fit pins by means of an adjusting machine. These press-fit pins 5.1, 5.2 and 5.3 represent the mechanical connection of the optics module 4 to the circuit carrier 2. The press-fit pins 5.1, 5.2 and 5.3 have a stiffness which does not allow any bending due to the self-weight of the optics module 4 or due to a mechanical shock or due to other influences.

FIG. 1 shows the condition of the camera module 1 after the press-fit connection of the optics module 4 to the circuit carrier 2 has been established by way of the press-fit pins 5.1, 5.2 and 5.3.

Figure 2:
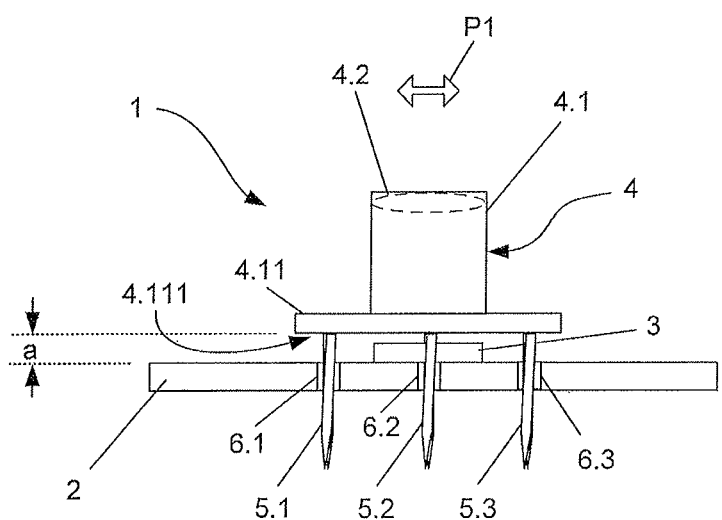
FIG. 2 shows a sectional view of the camera module according to FIG. 1 with an adjustment of the optics module in an x-y plane.
Figure 3:
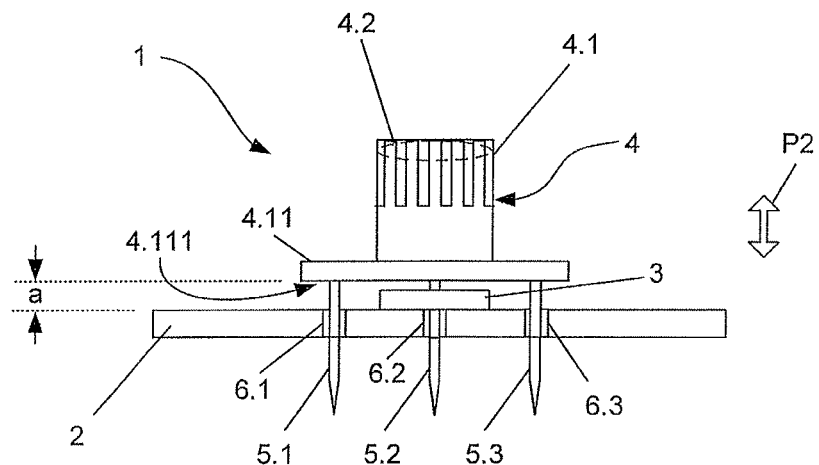
FIG. 3 shows a sectional view of the camera module according to FIG. 1 with an adjustment of the optics module in a z direction.

The optics module 4 can be adjusted in the x-y plane with respect to the image sensor chip 3 by forces exerted laterally by the adjusting machine to the optics module 4 or the optics housing 4.2 thereof, by utilizing the flexibility of the press-fit pins 5.1, 5.2 and 5.3. The press-fit pins 5.1, 5.2. and 5.3 are, in this case, slightly bent. It may be necessary for these press-fit pins to be overbent in order to compensate for a possible rebound. This adjustment in the x-y plane is indicated in FIG. 2 with an arrow P1, wherein the position of the optics module 4 shown in FIG. 1 is shown with ghost lines and from this a displacement of the optics module 4 to the right in the drawing plane is visible.

As the press-fit pins 5.1, 5.2 and 5.3 can also be slightly displaced in the pressed-in condition in the press-fit direction, i.e. in the z direction, the optics module 4 can also be adjusted in the z direction as shown by the arrow. P2 in FIG. 3, by increasing or reducing the distance a.

Figure 4:
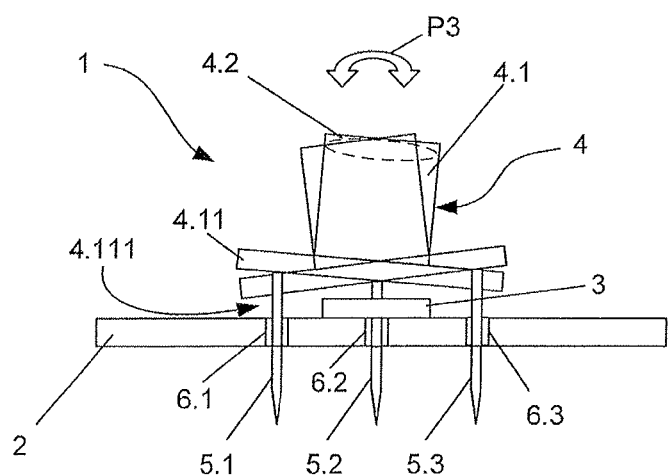
FIG. 4 shows a sectional view of the camera module according to FIG. 1 with an adjustment of a tilting of the optics module.

Finally, the tilting of the optics module 4 is also adjusted as indicated in FIG. 4 by means of the arrow P3 and two tilted positions of the optics module 4 with respect to the circuit carrier 2. The tilting is effected in that the press-fit pins 5.1, 5.2 and 5.3 are introduced at varying widths into the press-fit holes 6.1, 6.2 and 6.3 so that different distances between the bottom 4.111 and the surface of the circuit carrier 2 facing the optics module 4 are produced in the area of the press-fit pins 5.1, 5.2 and 5.3.

The circuit carrier 2 has a regular pattern of press-fit holes 6, which are arranged at equal distances in rows and columns in the manner of a grid around the image sensor chip 3. In this case, the press-fit holes 6 are arranged in such a manner that different press-fit options result for the press-fit pins 5.1, 5.2 and 5.3, i.e. the press-fit pins 5.1, 5.2 and 5.3 can be pressed into different press-fit holes 6.1, 6.2 and 6.3 so that the relative position of the optics module 4 changes in the x-y plane with respect to the image chip sensor 3. A preliminary adjustment in the x-y plane is made by making an appropriate selection of press-fit holes 6.1, 6.2 and 6.3 from this pattern, so that a precise adjustment and/or the final adjustment can subsequently be made according to FIGS. 2, 3 and 4 by utilizing the flexibility of the press-fit pins 5.1, 5.2 and 5.3.

A final adjustment can also be achieved by making an appropriate selection of the press-fit possibilities depending on the design and accuracy requirements, without the need for a further adjustment subsequently by means of the adjusting machine by utilizing the flexibility of the press-fit contacts.

Instead of the grid-like arrangement of the press-fit holes 6, other patterns such as e.g. multiple rings offset from each other can also be produced.

Figure 5:
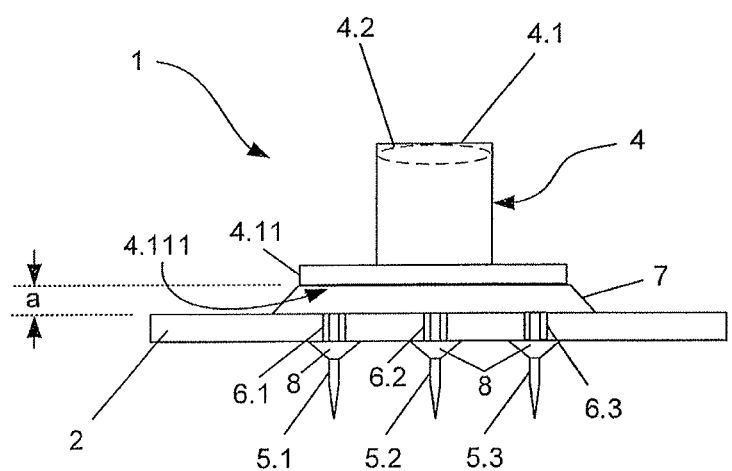
FIG. 5 shows a sectional view of a camera module having an adjusted optics module.

Following the adjustment of the optics module 4 with respect to the image sensor chip 3, the bottom 4.111 of the plate-like section 4.11 of the optics housing 4.1 can optionally be glued at the edge side with a glue bead 7 which bridges the distance a from the circuit carrier 2, as shown in FIG. 5. This seals the camera module 1 and strengthens the press-fit connection.

FIG. 5 shows another optional measure, according to which the press-fit pins 5.1, 5.2 and 5.3 on the surface of the circuit carrier 2 opposite the optics module 4 are soldered, in that an accumulation of soldering material 8 is applied, e.g. by wave soldering, and a further stabilization of the press-fit connection is achieved by such a soldering.

In the embodiment example according to FIGS. 1 to 5, the press-fit pins 5.1, 5.2 and 5.3 are exclusively used to mechanically connect the optics module 4 to the circuit carrier 2. In addition, it is also possible to embody the press-fit pins 5.1, 5.2 and 5.3 in order to electrically contact the optics module 4 with the circuit carrier 2. In such a case, the press-fit holes 6.1, 6.2 and 6.3 used also have a corresponding through-connections. The press-fit pins 5.1, 5.2 and 5.3 therefore not only serve as a mechanical connection means between the optics module 4 and the circuit carrier 2, but also to contact electrical or electronic components of the optics module 4.

LIST of REFERENCE SYMBOLS

Reference Numerals

1 Camera module

2 Circuit carrier, printed circuit board
3 Image sensor chip
4 Optics module
4.1 Optics housing of the optics module 4
4.2 Lens of the optics module 4
5.1 Press-fit pin of the optics housing 4.1
5.2 Press-fit pin of the optics housing 4.1
5.3 Press-fit pin of the optics housing 4.1
6 Press-fit holes of the circuit carrier 2
6.1 Press-fit hole of the circuit carrier 2
6.2 Press-fit hole of the circuit carrier 2
6.3 Press-fit hole of the circuit carrier 2
7 Adhesive, adhesive bead
8 Accumulation of soldering material

The invention claimed is:

1. A camera module comprising:
a circuit carrier,
an image sensor chip arranged on the circuit carrier, and
an optics module with an optics housing accommodating a lens, wherein
the optics housing is embodied with at least three press-fit pins,
the optics housing is connected to the circuit carrier by way of the at least three press-fit pins with a predetermined distance from the circuit carrier, wherein the circuit carrier is embodied with at least three press-fit holes for establishing a press-fit connection with the press-fit pin, and
wherein the at least three press-fit pins are embodied flexibly in such a manner that the optics housing is adjusted to the image sensor chip by utilizing the flexibility of the press-fit pins as a result of a relative change in position produced by an adjusting machine with respect to the circuit carrier.

2. The camera module according to claim 1, wherein the adjusted optics housing is connected to the circuit carrier by an adhesive connection bridging the distance thereof from the circuit carrier.

3. The camera module according to claim 1, wherein the projecting press-fit pins on the side of the circuit carrier facing away from the optics module are embodied with an accumulation of soldering material lying in contact with the circuit carrier.

4. The camera module according to claim 1, wherein the circuit carrier is embodied as a printed circuit board.

5. The camera module according to claim 1, wherein the press-fit pins electrically contact the optics module with the circuit carrier.

6. The camera module according to claim 1, wherein in order to create multiple press-fit connections which differ in the relative position of the optics housing to the circuit carrier, the circuit carrier comprises a regular pattern of press-fit holes, with which the optics housing is adjusted relative to the circuit carrier in a plane parallel to the circuit carrier through a selection of the at least three press-fit holes.

7. A camera module comprising:
a circuit carrier,
an image sensor chip arranged on the circuit carrier, and
an optics module with an optics housing accommodating a lens, wherein
the optics housing is embodied with at least three press-fit pins,
the optics housing is connected to the circuit carrier by way of the at least three press-fit pins with a predetermined distance from the circuit carrier, wherein the circuit carrier is embodied with at least three press-fit holes for establishing a press-fit connection with the press-fit pin, and
wherein, in order to create multiple press-fit connections which differ in the relative position of the optics housing to the circuit carrier, the circuit carrier comprises a regular pattern of press-fit holes, with which the optics housing is adjusted relative to the circuit carrier in a plane parallel to the circuit carrier through a selection of the at least three press-fit holes.

8. A method for producing a camera module comprising:
providing a circuit carrier, on which an image sensor chip is arranged,
providing an optics module with an optics housing accommodating a lens,
embodying the optics housing with at least three flexible press-fit pins, and
connecting the optics housing to the circuit carrier by way of the three flexible press-fit pins with a predetermined distance from the circuit carrier, wherein the circuit carrier is embodied with at least three press-fit holes for establishing a press-fit connection by the press-fit pins,
wherein the at least three press-fit pins are embodied flexibly in such a manner that the optics housing is adjusted to the image sensor chip by utilizing the flexibility of the press-fit pins as a result of a relative change in position produced by an adjusting machine with respect to the circuit carrier.

9. The method according to claim 8, wherein the adjusted or preliminarily adjusted optics housing is connected to the circuit carrier by an adhesive connection bridging the distance (a) thereof from the circuit carrier.

10. The method according to claim 8, wherein, the projecting press-fit pins on the side of the circuit carrier facing away from the optics module are embodied with an accumulation of soldering material lying in contact with the circuit carrier.

11. The method according to claim 8, wherein in order to create multiple press-fit connections which differ in the relative position of the optics housing to the circuit carrier, the circuit carrier comprises a regular pattern of press-fit holes, with which the optics housing is adjusted relative to the circuit carrier in a plane parallel to the circuit carrier through a selection of the at least three press-fit holes.

12. A method for producing a camera module comprising:
providing a circuit carrier, on which an image sensor chip is arranged,
providing an optics module with an optics housing accommodating a lens,
embodying the optics housing with at least three flexible press-fit pins, and
connecting the optics housing to the circuit carrier by way of the three flexible press-fit pins with a predetermined distance from the circuit carrier, wherein the circuit carrier is embodied with at least three press-fit holes for establishing a press-fit connection by the press-fit pins,
wherein in order to create multiple press-fit connections which differ in the relative position of the optics housing to the circuit carrier, the circuit carrier comprises a regular pattern of press-fit holes, with which the optics housing is adjusted relative to the circuit carrier in a plane parallel to the circuit carrier through a selection of the at least three press-fit holes.

13. The method according to claim 12, wherein the adjusted or preliminarily adjusted optics housing is connected to the circuit carrier by an adhesive connection bridging the distance thereof from the circuit carrier.

* * * * *